(12) United States Patent
Morikado

(10) Patent No.: US 7,915,680 B2
(45) Date of Patent: Mar. 29, 2011

(54) SEMICONDUCTOR DEVICE AND MANUFACTURING METHOD OF THE SAME

(75) Inventor: Mutsuo Morikado, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 524 days.

(21) Appl. No.: 11/470,859

(22) Filed: Sep. 7, 2006

(65) Prior Publication Data

US 2007/0057326 A1    Mar. 15, 2007

(30) Foreign Application Priority Data

Sep. 7, 2005  (JP) ................................ 2005-259494

(51) Int. Cl.
*H01L 29/94* (2006.01)
(52) U.S. Cl. ......... 257/347; 257/348; 257/350; 257/316
(58) Field of Classification Search .................. 257/347, 257/348, 350, 316
See application file for complete search history.

(56) References Cited

U.S. PATENT DOCUMENTS

| 5,982,004 A * | 11/1999 | Sin et al. ........................ 257/347 |
| 6,621,725 B2* | 9/2003 | Ohsawa ........................ 365/150 |
| 6,864,540 B1* | 3/2005 | Divakaruni et al. .......... 257/368 |

FOREIGN PATENT DOCUMENTS

JP    2001-298171    10/2001
JP    2005-259494    9/2005

OTHER PUBLICATIONS

Office Action issued Sep. 24, 2010, in Japanese Patent Application No. 2005-259494 filed Sep. 7, 2005 (w/English language translation).

* cited by examiner

*Primary Examiner* — Bradley K Smith
*Assistant Examiner* — Alexander Belousov
(74) *Attorney, Agent, or Firm* — Oblon, Spivak, McClelland, Maier & Neustadt, L.L.P.

(57) ABSTRACT

A semiconductor device comprises: a channel region of a transistor formed in a predetermined region of silicon layer formed on insulation film; a gate electrode formed on the channel region via gate insulation film; and source/drain regions formed in the silicon layer thicker than said channel region located out of the channel region, wherein the transistor is a memory element constituting the channel region as a floating body cell.

6 Claims, 13 Drawing Sheets

SEMICONDUCTOR DEVICE AND MANUFACTURING METHOD OF THE SAME

CROSS REFERENCE TO RELATED APPLICATION

This application is based upon and claims the benefit of priority from the prior Japanese Patent Applications No. 2005-259494, filed on Sep. 7, 2005; the entire contents of which are incorporated herein by reference.

BACKGROUND OF THE INVENTION

The present invention relates to a semiconductor device and more particularly to a semiconductor memory device using a silicon on insulator (SOI) substrate. The present invention also relates to a manufacturing method of the semiconductor device.

The SOI substrate in which an insulation film (buried insulation film) is provided on a silicon substrate and a silicon layer is provided on the insulation film has been known in, for example, Japanese Patent Application Laid-Open Publication No. 2001-298171 and Japanese Patent Application Laid-Open Publication No. 5-257356(1993).

A semiconductor memory device having a floating body cell (FBC) memory cell with a portion corresponding to a channel region of MOS transistor formed in the silicon layer on the buried insulation film of such an SOI substrate used as a floating body so as to accumulate electric charges has been developed.

In such a semiconductor memory device, the area of its memory cell can be extremely reduced because a capacitor may be eliminated, so that high integration can be achieved and accordingly the memory capacity per unit area can be increased.

In the FBC, as far as SOI film thickness concerned, as the degree of depleted condition is intensified to full depleted (FD) condition, namely, the thinner the SOI film be, the higher $\Delta V$th which can serve as a criterion when detecting information accumulated in the memory cell may be increased. This $\Delta V$th indicates a difference between Vth when "0" data is stored and Vth when "1" data is stored.

Because this FD condition is easier to be obtained as the thickness of the SOI film is decreased, the thickness of the SOI film is required to be decreased as much as possible from viewpoints of improvement (increase of $\Delta V$th) of the performance of the memory cell of the FBC cell.

Furthermore, the BOX film which is buried oxide film is preferred to be as thin as possible in order to improve coupling between the body and a substrate electrode (hereinafter referred to a plate electrode) of the memory cell. Therefore, both of the buried oxide film and the SOI film thereon are preferred to be as thin as possible.

However, manufacturing of a SOI wafer with the BOX film set to less than 60 Angstrom in thickness and the SOI film set to less than 300 Angstrom in the SOI substrate requires highly accurate control of wafer manufacturing process, thereby leading to increase in wafer manufacturing cost, which is a large obstacle to achievement of an excellent FBC.

If the thickness of the SOI film is too small, when a contact is formed, not only electric short-circuit is likely to occur between the contact and plate potential but also contact resistance is increased, which is a problem to be solved. Although the SOI film can be thinned uniformly, if the SOI film is thinned to about 20 nm, the $\Delta V$th is decreased, so that an intention of improving performance using a device under a fully depleted condition by thinning the SOI film is not achieved.

Additionally, if the BOX film is thinned extremely, diffusion capacitance increases so that sharing of process with a logic section, which is a large advantage of the FBC, becomes impossible.

SUMMARY OF THE INVENTION

According to a first aspect of the present invention, there is provided a semiconductor device comprising:
a channel region of a transistor formed in a predetermined region of silicon layer formed on insulation film;
a gate electrode formed on the channel region via gate insulation film; and
source/drain regions formed in the silicon layer thicker than said channel region located out of the channel region, wherein the transistor is a memory element constituting the channel region as a floating body cell.

According to a second aspect of the present invention, there is provided a semiconductor device comprising:
a channel region of transistor formed in a predetermined region of silicon layer formed on insulation film;
a gate electrode formed on the channel region via gate insulation film; and
a source region and a drain region formed in the silicon layer out of the channel region, said silicon layer having the same thickness of the channel region in the drain side while having thicker thickness than the channel region in the source side, wherein the transistor is a memory element constituting the channel region as a floating body cell.

According to a third aspect of the present invention, there is provided a method of manufacturing a semiconductor device, comprising:
forming stacked layers of a buried oxide film, a silicon film and silicon nitride film on a silicon substrate;
etching the nitride film to remain it for element region;
etching the silicon film and the buried oxide film to remain them for the element region;
filling an insulating film in a portion removed by the etching;
forming a trench in the silicon layer and the silicon nitride layer in the element region, the bottom of the trench being positioned in the thickness of the silicon film;
filling a gate material in the trench;
selectively removing the silicon nitride layer;
ion implanting to form source/drain regions; and
forming interconnections for leading out the source/drain and gate regions.

DETAILED DESCRIPTION OF THE INVENTION

Hereinafter, the embodiments of the present invention will be described in detail by taking a semiconductor memory device having a FBC memory cell as an example. Drawings shown below are not accurate representation of film thickness and the like but schematic ones.

(1) First Embodiment

An example of first manufacturing process for manufacturing a semiconductor device according to a first embodiment of the present invention will be described with reference to FIGS. 1A-1L.

Figure 1A:
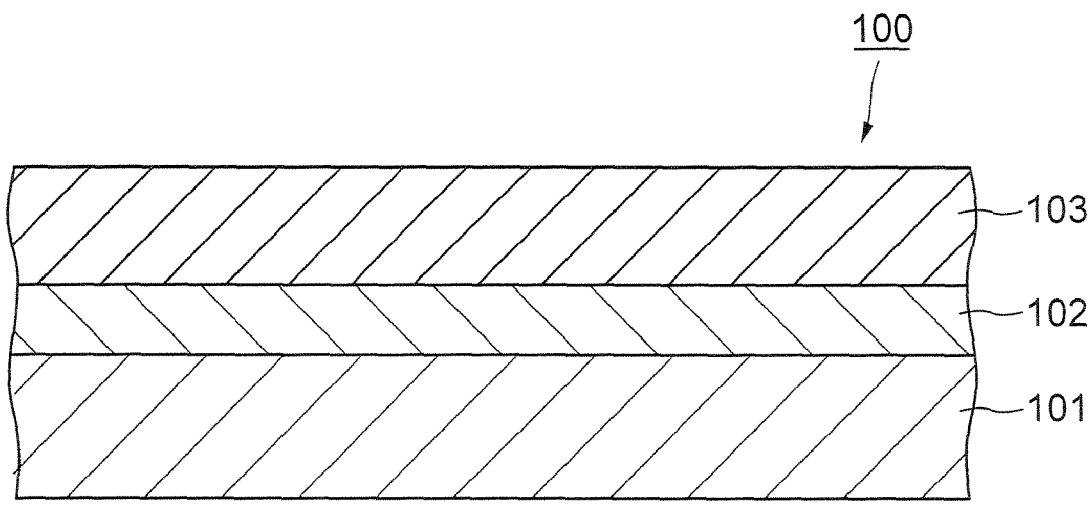
FIGS. 1A-1L are sectional views of a semiconductor device on respective steps showing a manufacturing method of the semiconductor device according to a first embodiment of the present invention.

First, a SOI substrate 100 in which buried oxide film (BOX film) 102 in the thickness of 250 Angstrom is provided on a silicon semiconductor base material 101 and silicon film (SOI film) 103 in the thickness of 1500 Angstrom is formed thereon is prepared (FIG. 1A).

Figure 1B:
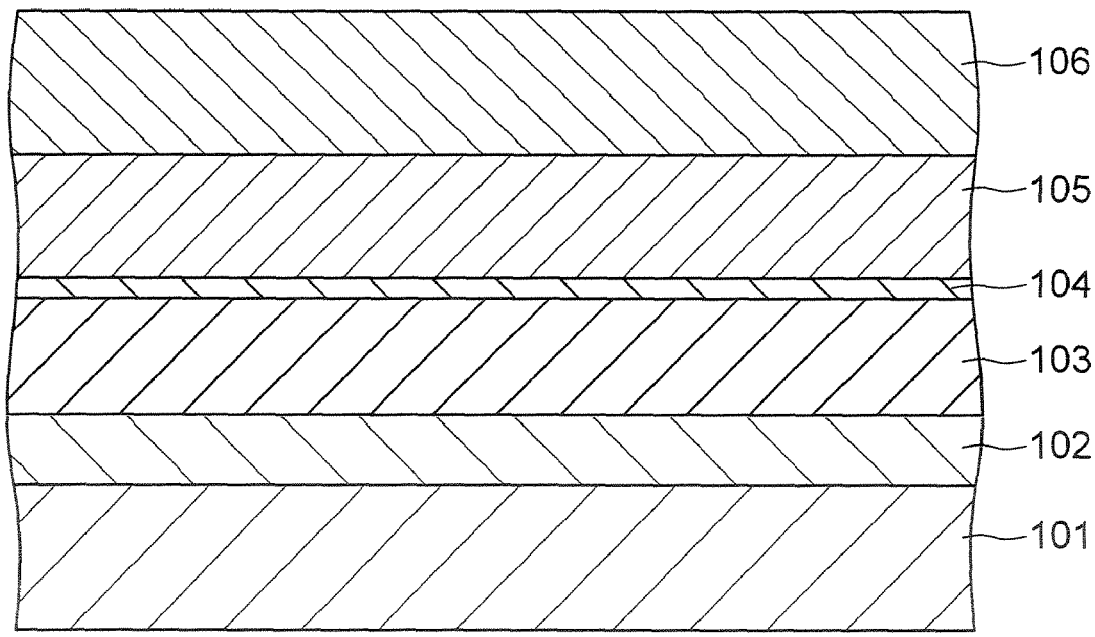

Next, thermally-oxidized film 104 about 20 Angstrom thick is formed by heating the SOI substrate 100 in oxidation atmosphere and subsequently, SiN film 105 in the thickness of 1700 Angstrom is deposited and further, boro silicate glass (BSG) film 106 in the thickness of 3000 Angstrom is deposited (FIG. 1B).

Figure 1C:
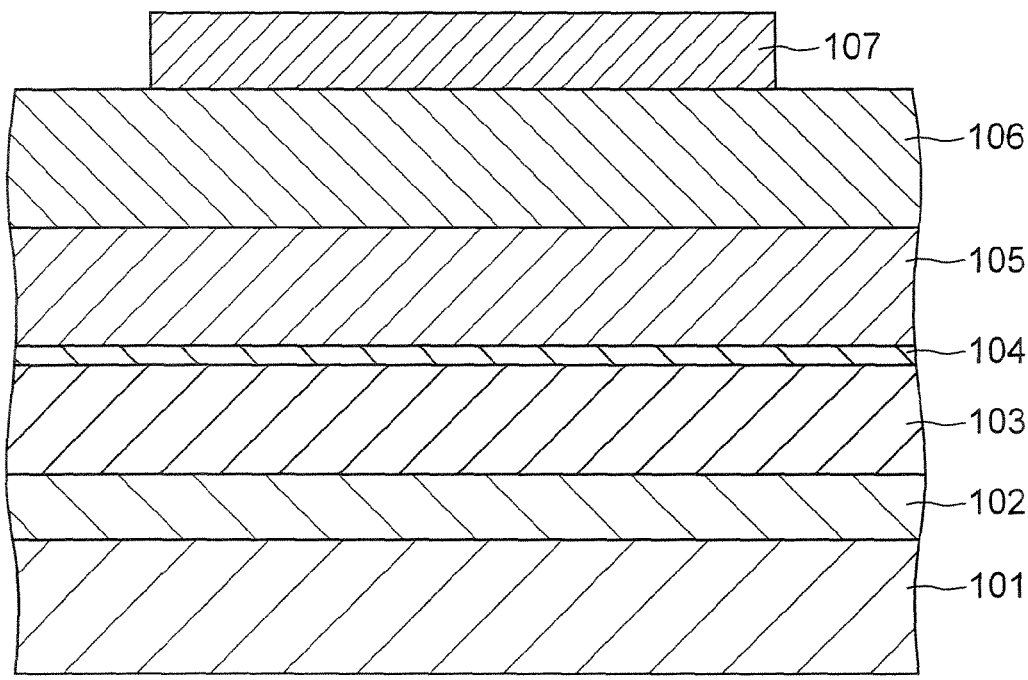

Next, resist pattern is formed for forming a device region of a desired pattern. That is, photo resist 107 is applied on its entire surface and the resist pattern is formed by patterning using photo lithography method. This pattern is a shape for keeping a portion corresponding to a device isolation expected region of a transistor to be formed later remained (FIG. 1C).

Figure 1D:
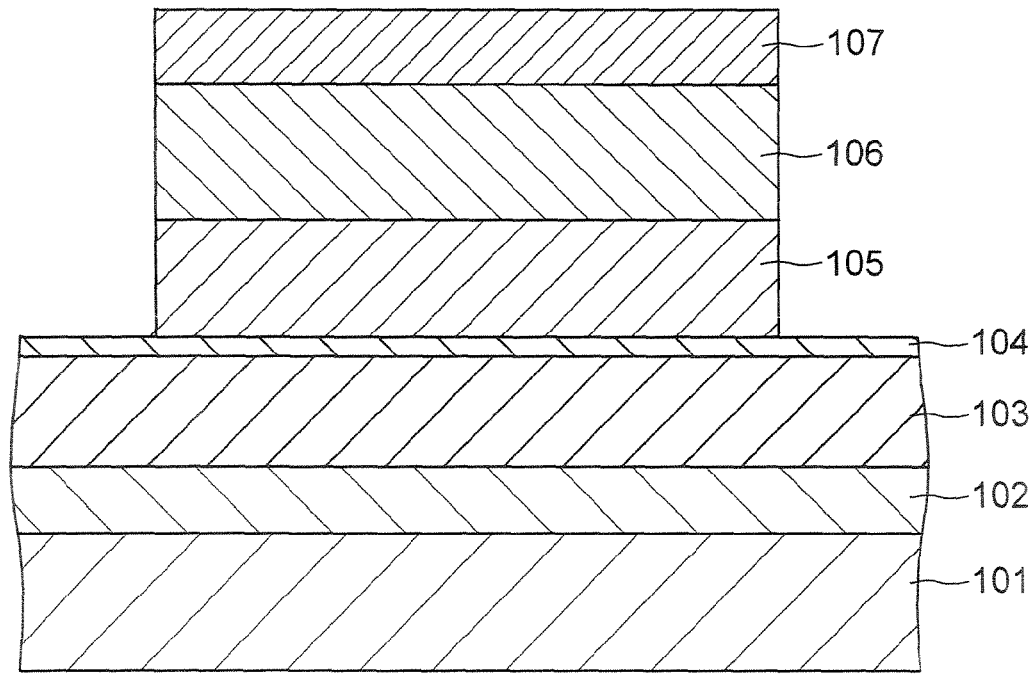

The BSG film and SiN film are etched and removed using anisotropic etching method like RIE with employing the patterned resist 107 as masking material. As a consequence, the SOI film 103 and thermally-oxidized film 104 in the device isolation expected region are exposed outside (FIG. 1D).

Subsequently, after the resist film 107 remained on the SOI substrate is removed, the SOI film 103 and the thermally-oxidized film 104 are etched using reactive ion etching (RIE) method with employing the BSG/BiN films 105-106 as masking materials. This etching depth is set to, for example, 1500 Angstrom. Therefore, the SOI film out of the device formation area is removed.

Figure 1E:
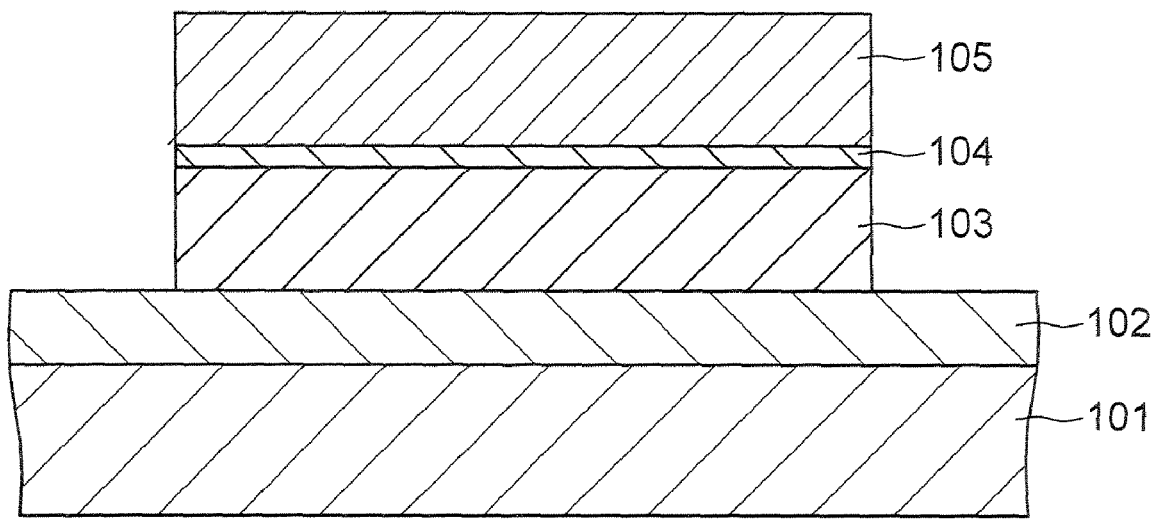

After this etching, reaction product at the time of etching is removed by washing and subsequently, the BSG film existing on the SiN film 105 is removed according to, for example, wet etching method (FIG. 1E).

Figure 1F:
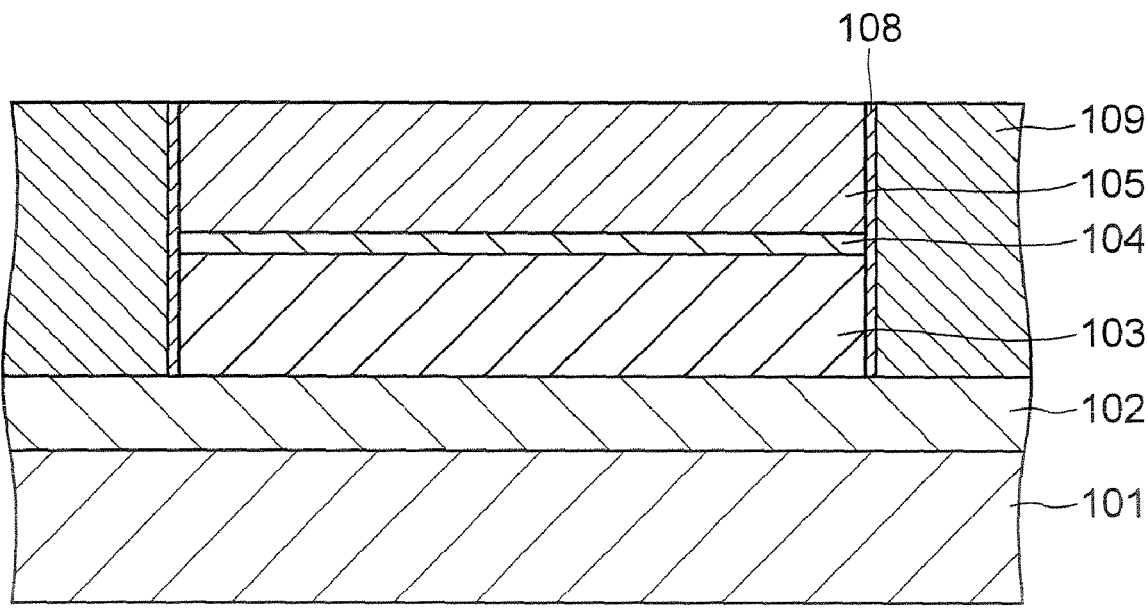

Then, thermally-oxidized film 108 is formed in the thickness of 40 Angstrom on the side face of the exposed SOI film 103 by thermal oxidation. The side portion of this thermally-oxide film is filled with TEOS film 109 because there is a trench with respect to a device formation area of an adjacent cell. Subsequently, according to CMP method (chemical mechanical polishing method) with the SiN film on the SOI used as stopper film, TEOS of a unnecessary portion is removed and flattened so as to form shallow trench isolation (STI). At this time, the remained film on the wafer of the SiN film is about 1500 Angstrom (FIG. 1F).

Figure 1G:
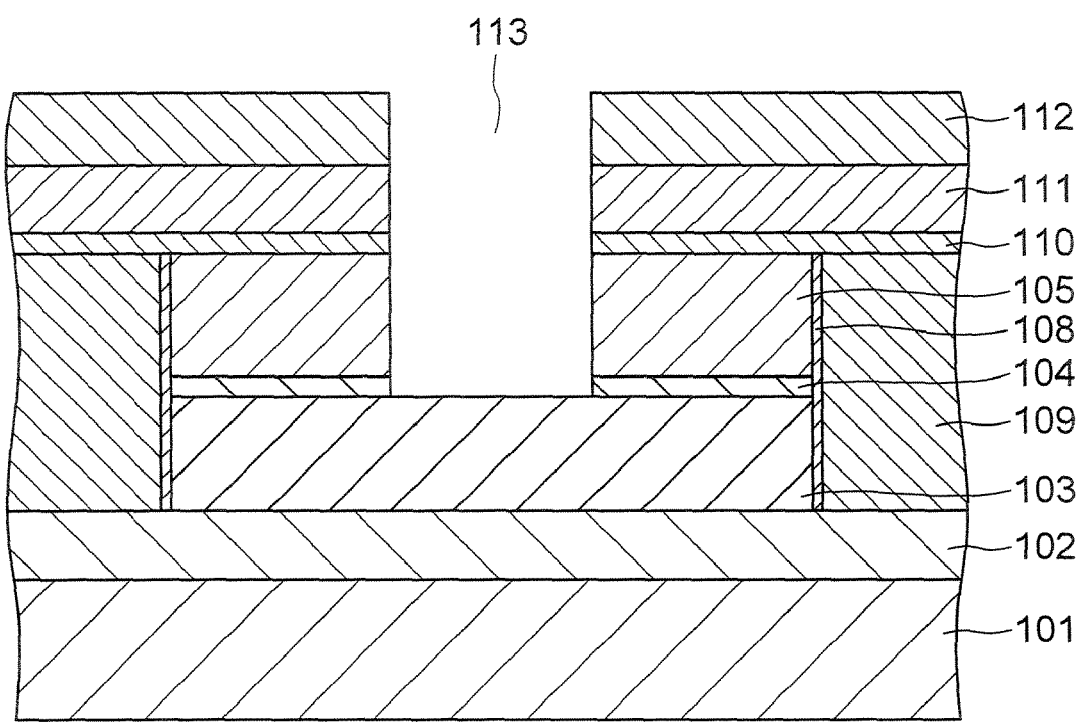

Next, resist pattern in which only a cell portion is exposed is formed and after that, the resist is removed by ion-implantation of phosphor for plate electrode formation. SiN film 110 is deposited on the SOI wafer in the thickness of 200 Angstrom and next, BSG film 111 is deposited in the thickness of 1000 Angstrom (FIG. 1(G)). Resist pattern 112 is formed such that the BSG film corresponding to a gate electrode is exposed and with this resist 112 used as masking material, the BSG/SiN 111, 110, the SiN film 105, and the thermally-oxidized film 104 are etched up to the face of the SOI substrate 103 so as to form a trench 113 with the top face of the SOI 103 exposed outside (FIG. 1G).

After the remained resist 112 is removed, a pattern in which the SOI portion expected to be formed into thin film is exposed is formed and by etching the exposed SOI film 103 according to the CDE method, a deeper trench 114 is formed so that the thickness of the SOI film 103 is adjusted to a desired thickness, for example, 400 Angstrom.

Figure 1H:
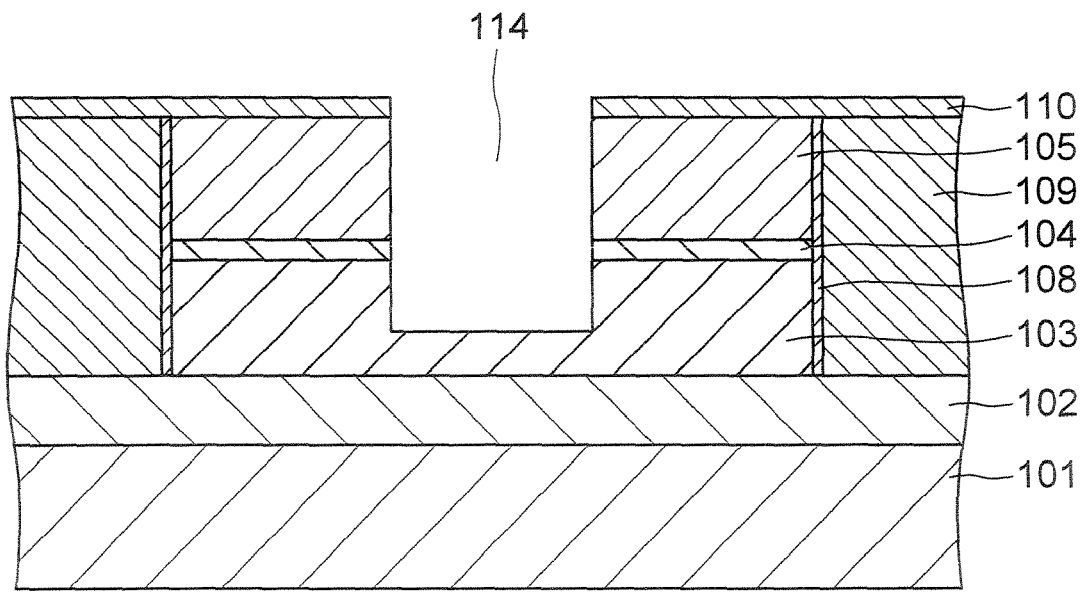
Figure 1:
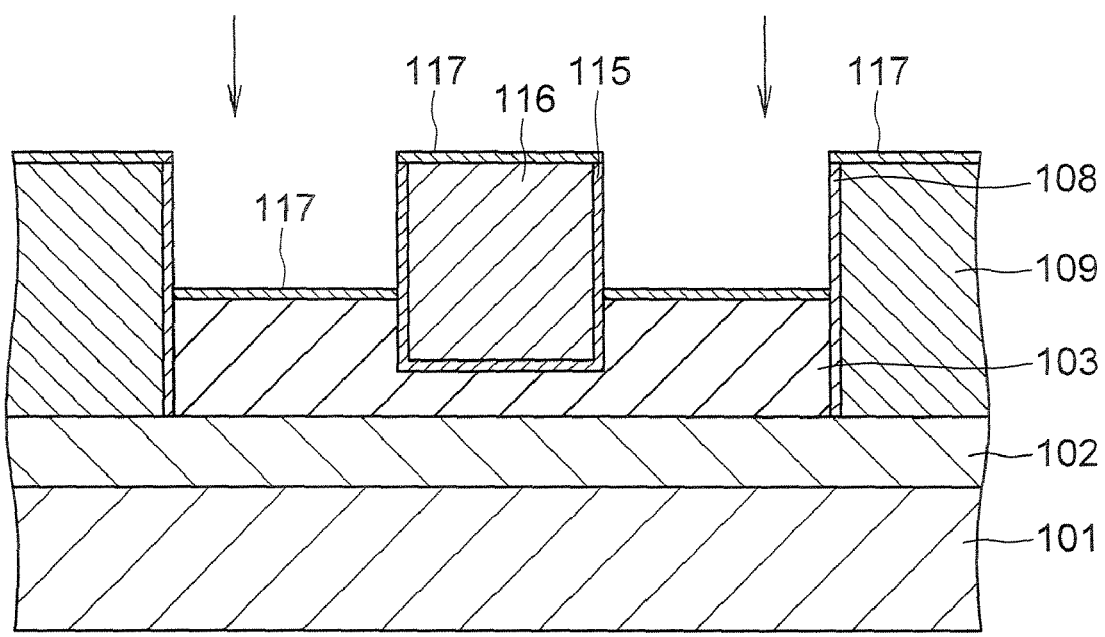

Next, the BSG film 111 remained on the SiN film 110 on the SOI substrate is removed by etching according to vacuum plasma method (VPC) and if necessary, ion implantation for Vt adjustment of Tr is carried out (FIG. 1H).

Therefore, the thickness at a gate electrode formation expected location is reduced from the initially 1500 Angstrom to 400 Angstrom.

Next, thermally-oxidized film 115 is formed in the thickness of 60 Angstrom on the bottom and side wall of the trench 114 by thermal oxidation with this SOI 103 exposed and amorphous silicon doped with no impurity is deposited on the entire surface in the thickness of 2000 Angstrom so as to fill the trench 114. Then, gate electrode 116 is formed according to damascene process for flattening using the CMP method.

Next, the SiN film 105 remained on the SOI substrate is removed using a chemical such as $H_3PO_4$ and oxide film 117 is formed on the surface of the SOI substrate 103 and the surface of the gate electrode 116 by post oxidation and ion implantation is carried out for doping for formation of desired diffusion layer. This ion implantation is carried out under a condition that dose of phosphor or boron is $3\times10^{13}$ (hereinafter expressed as 3E13)/cm$^2$ and acceleration voltage is 10 keV (FIG. 1I).

Figure 1J:
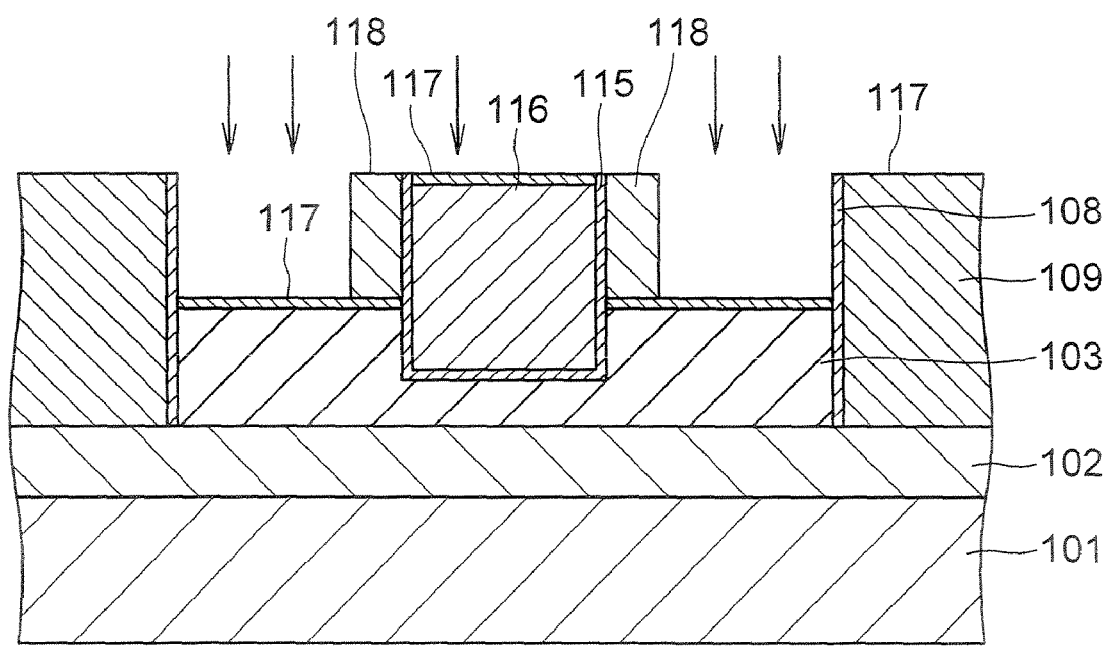

Next, layered film in the thickness of TEOS/SiN/TEOS 200/200/400 Angstrom are deposited on the entire surface of the SOI substrate and etching is carried out for leaving spacer 118 adjacent to the gate electrode 116 so as to expose the top face of the SOI substrate and polysilicon electrode. Then, phosphor or boron is ion-implanted into a desired region at a dose of 3E15/cm$^2$ or more at an acceleration voltage of 10 keV so that impurity is activated at high temperature for a short time according to RTA method (FIG. 1J).

After activation is completed, the post oxidized film 117 is removed, cobalt (Co) is deposited on the entire surface of the SOI substrate and salicide film 119 is formed at a portion making direct contact with silicon by heat treatment. Excess cobalt at a portion in which no silicon exists is removed by etching.

Figure 1K:
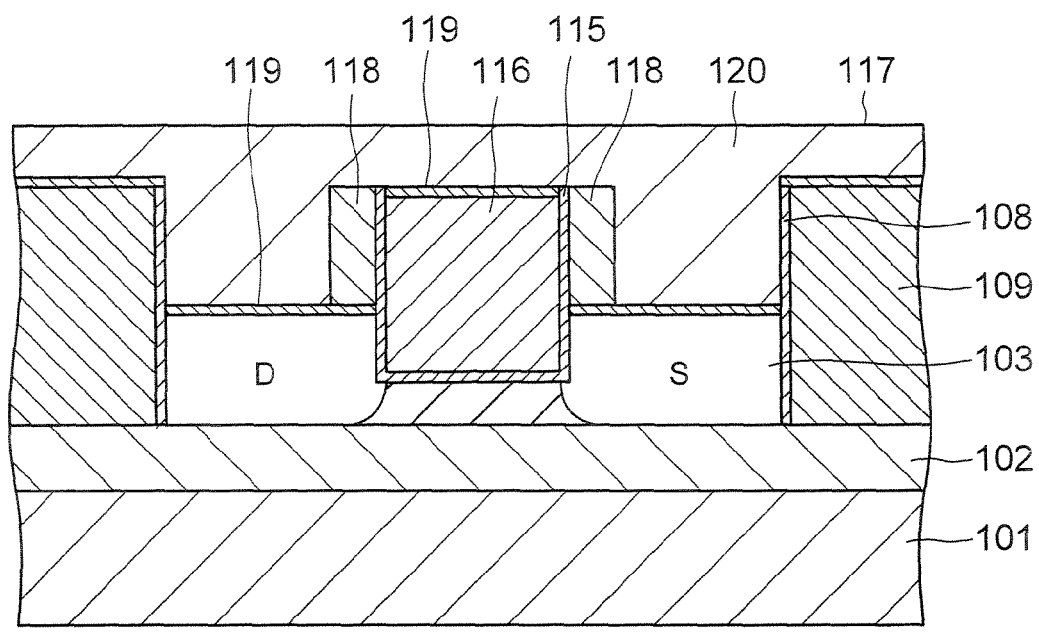

After the salicide film is formed, SiN is deposited in the thickness of 200 Angstrom on the entire surface of wafer and next non-doped silicate glass (NSG) film 120, which is silicate glass doped with no impurity, is deposited in the thickness of 6000 Angstrom and then it is flattened according to the CMP method (FIG. 1K).

Figure 1L:
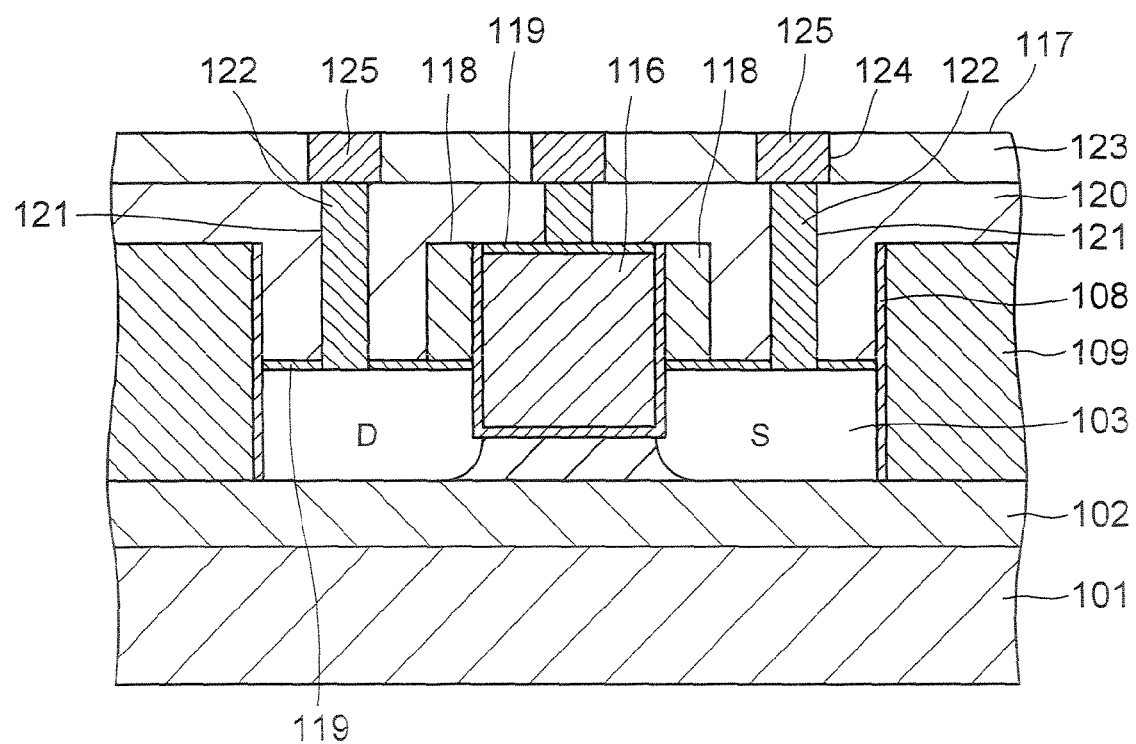

Next, resist pattern for forming a contact between source/drain region and gate electrode is formed and the NSG film 120 is etched according to the RIE method until the top face of the SiN is exposed so as to form a contact hole 121 and remained resist is removed. Next, the SiN film exposed on the bottom of the contact hole 121 is removed by etching so that the top face of SOI/gate polysilicon is exposed within the contact hole 121 and then, three-layered film of Ti/TiN/W are deposited in the thickness of 100/200/3000 Angstrom respectively. Then, the Ti/TiN/W of other portion than the contact portion is removed according to the CMP method so that the Ti/TiN/W layered film 122 is left only inside the contact. Next, NSG film 123 about 3000 Angstrom is deposited and a channel 124 is formed at a portion corresponding to a wiring layer pattern and Cu is deposited therein by plating. Then, SL electrode 125 is formed by etching the Cu at an unnecessary portion according to the CMP method (FIG. 1L).

After that, wiring metal layer and contact are formed using dual damascene process of executing these at the same time as filling a contact with metal (Cu) and finally, a semiconductor device is completed.

Because in the semiconductor device of this embodiment, the thickness of the SOI film at the channel portion is sufficiently small, FD state can be attained so as to increase ΔVth. This is particularly advantageous when this semiconductor device is used as a semiconductor device containing FBC cell.

Further, because according to the manufacturing process described above of this semiconductor device, when FBC memory cell is manufactured using a thick SOI substrate, the gate electrode of a memory cell is formed by using damascene process in which a channel is formed by reducing the film thickness of the SOI portion in a channel region until a desired thickness is reached before formation of gate insulation film and this channel is filled with gate electrode material, stabilized thin SOI film having a high reliability can be obtained.

Further, because the thickness of the SOI film in other region than the channel region of the gate electrode bottom portion is a thickness which may be formed easily using current SOI wafer manufacturing technology, increase in manufacturing cost of the SOI wafer can be prevented.

Furthermore, because the SOI film thickness in other region than the channel region is sufficiently large, electric short-circuit between the contact and plate potential upon formation of a contact can be prevented easily.

FIGS. 2A-2L are sectional views of a semiconductor device for explaining a second manufacturing process for manufacturing the semiconductor device according to the second embodiment of the present invention.

Figure 2A:
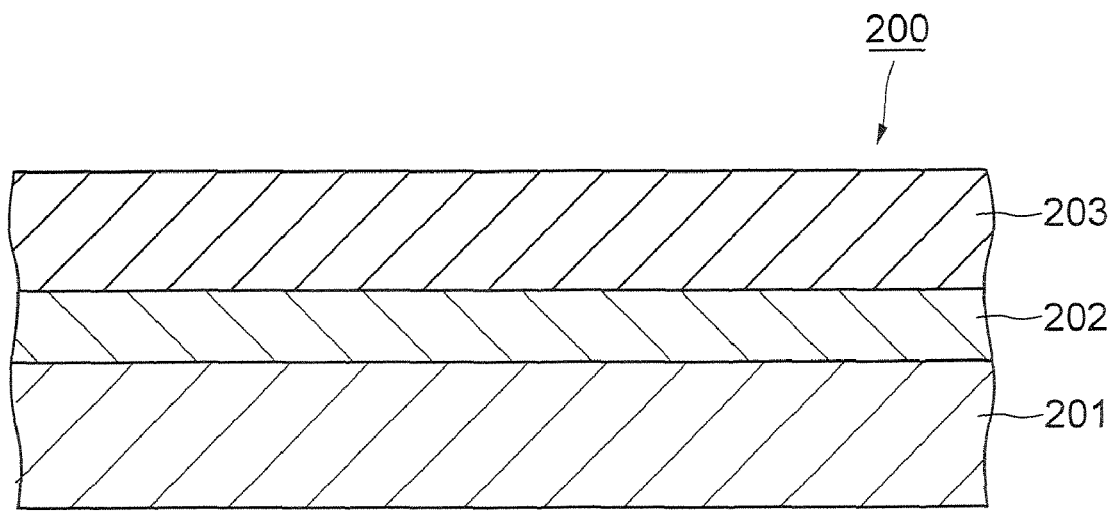
FIGS. 2A-2L are sectional views of a semiconductor device of respective steps showing a manufacturing method of the semiconductor device according to a second embodiment of the present invention.

Here, SOI substrate in 200 which BOX film 202 in the thickness of 250 Angstrom and SOI film 203 in the thickness of 1500 Angstrom are provided on silicon substrate 201 like the first embodiment is used (FIG. 2A).

Figure 2B:
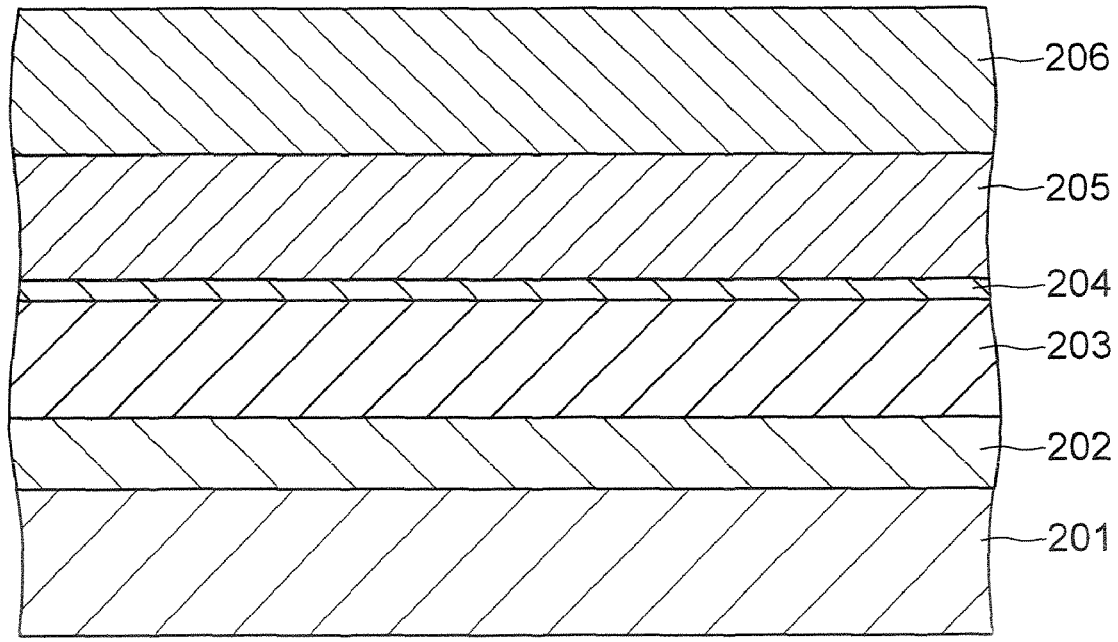

Next, thermally-oxidized film 204 about 20 Angstrom is formed by heating the SOI substrate 200 in oxidation atmosphere and subsequently, SiN film 205 in the thickness of 1700 Angstrom is deposited and further, boron silicate glass (BSG) film 206 in the thickness of 3000 Angstrom is deposited (FIG. 2B).

Figure 2C:
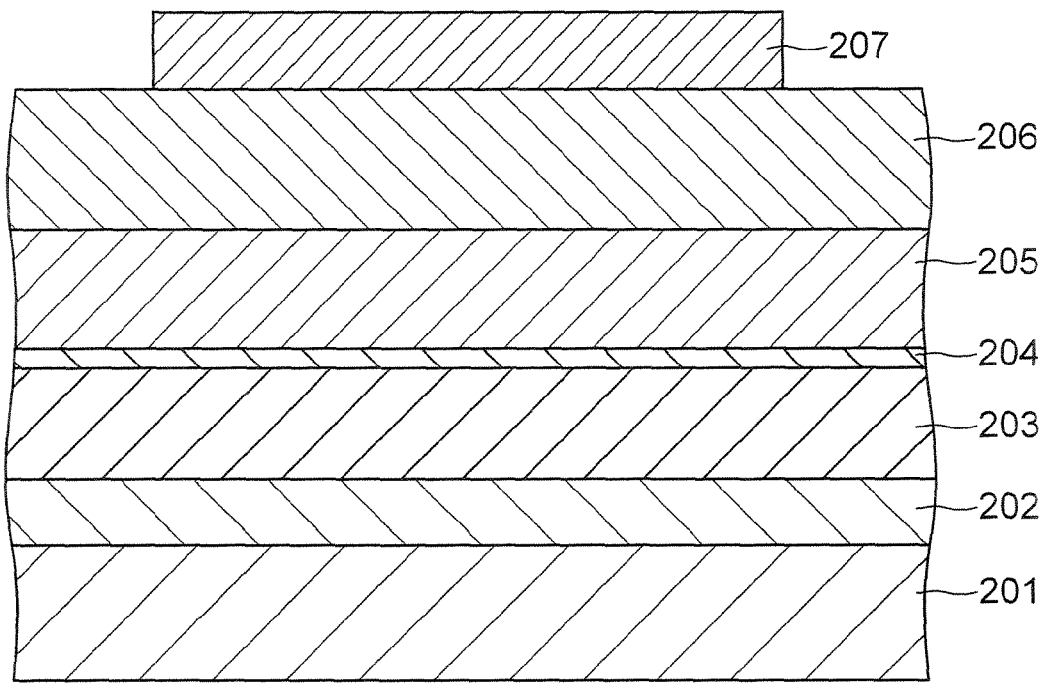

Next, resist pattern is formed for forming a device region of a desired pattern. That is, photo resist 207 is applied on its entire surface and the resist pattern is formed by patterning using photo lithography method. This pattern has a shape for keeping a portion corresponding to a device isolation expected region of a transistor to be formed later remained (FIG. 2C).

Figure 2D:
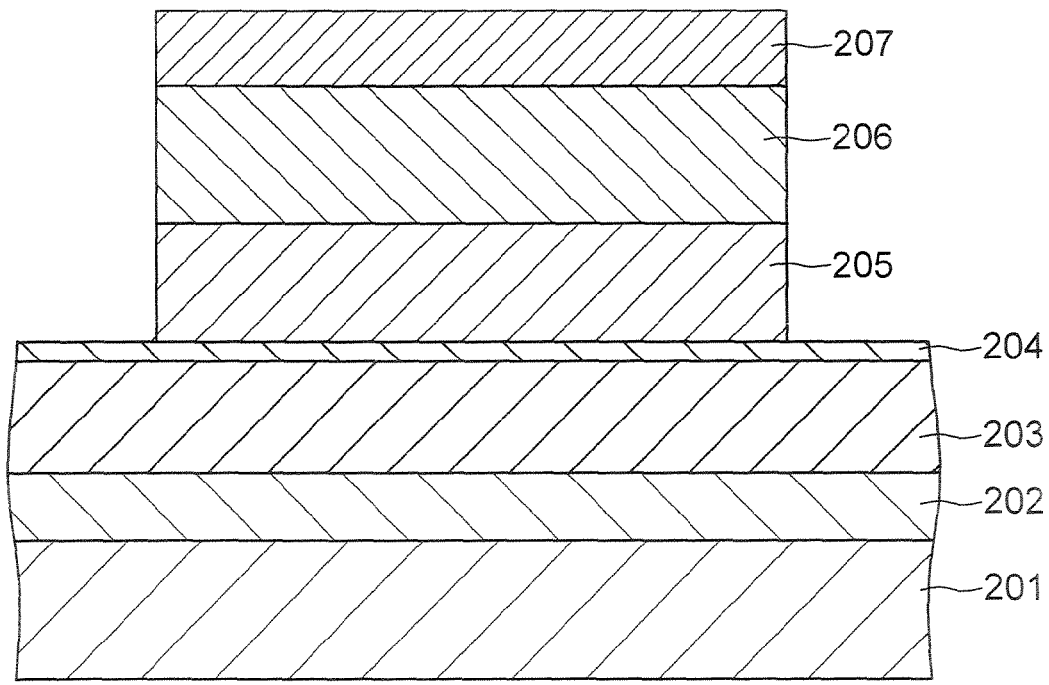

The BSG film 206 and SiN film 205 are etched and removed according to anisotropic etching method like RIE by using this patterned resist 207 as masking material. As a consequence, the SOI film 203 and thermally-oxidized film 204 in the device isolation expected region are exposed outside (FIG. 2D).

Subsequently, after the resist film 207 remained on the SOI substrate is removed, the SOI film 203 and the thermally-oxidized film 204 are etched according to reactive ion etching (RIE) method by using the BSG/BiN films 205-206 as masking materials. This etching depth is set to, for example, 1500 Angstrom. Therefore, the SOI film 203 out of the device formation area is removed.

Figure 2E:
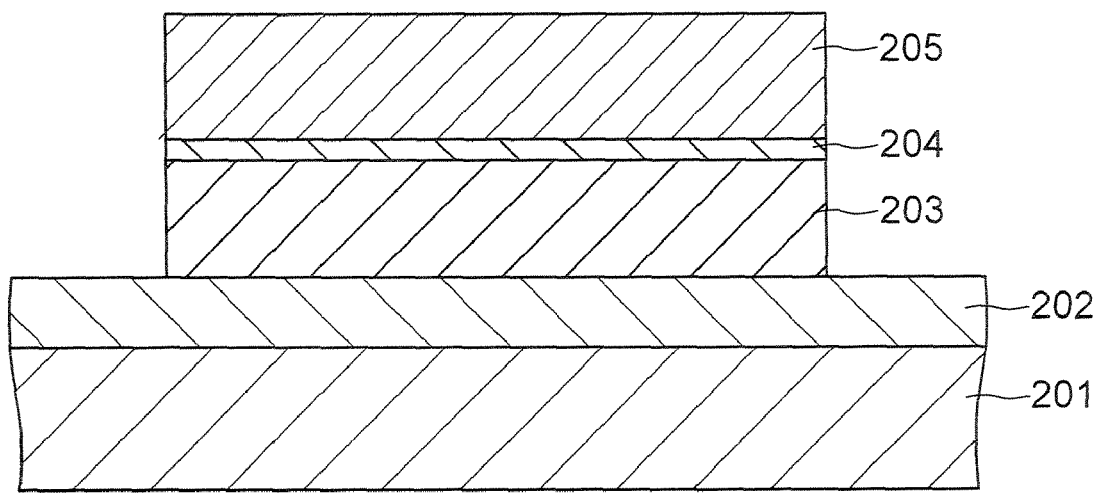

After this etching, reaction product at the time of etching is removed by washing and subsequently, the BSG film 206 existing on the SiN film 205 is removed according to, for example, wet etching method (FIG. 2E).

Figure 2F:
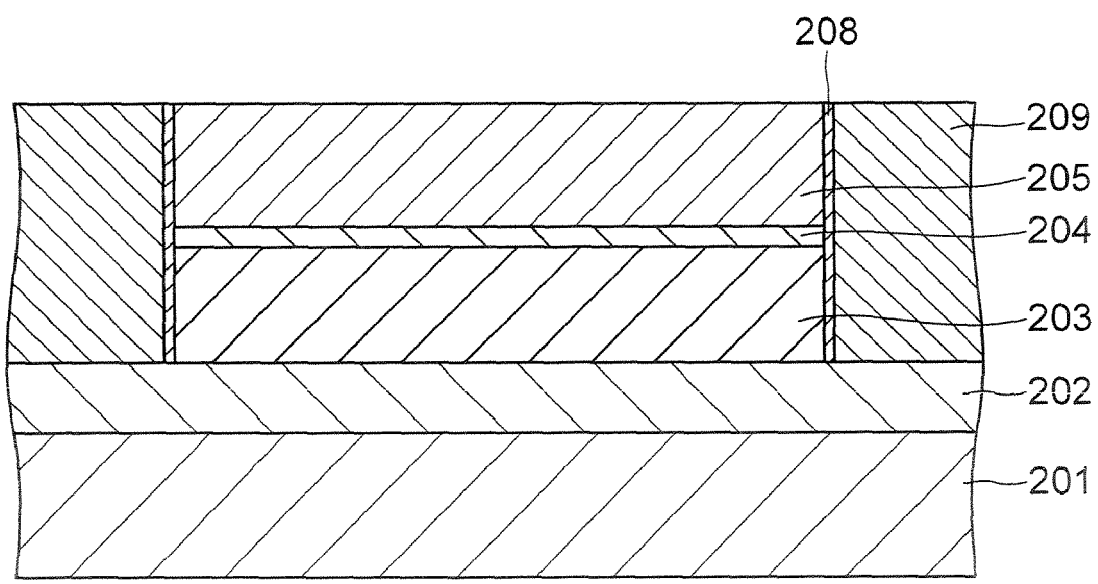

Then, thermally-oxidized film 208 is formed in the thickness of about 40 Angstrom on the side face of the exposed SOI film 203 by thermal oxidation. The side portion of this thermally-oxide film is filled with TEOS film 209 because there is a trench with respect to a device formation area of an adjacent cell. Subsequently, according to CMP method (chemical mechanical polishing method) with the SiN film on the SOI used as stopper film, TEOS of a unnecessary portion is removed and flattened so as to form shallow trench isolation (STI). At this time, the remained film on the wafer of the SiN film is about 1300 Angstrom (FIG. 2F).

Next, resist pattern in which only a cell portion is exposed is formed and after that, the resist is removed by ion-implantation of phosphor for plate electrode formation. SiN film 210 is deposited on the SOI wafer in the thickness of 200 Angstrom.

Figure 2G:
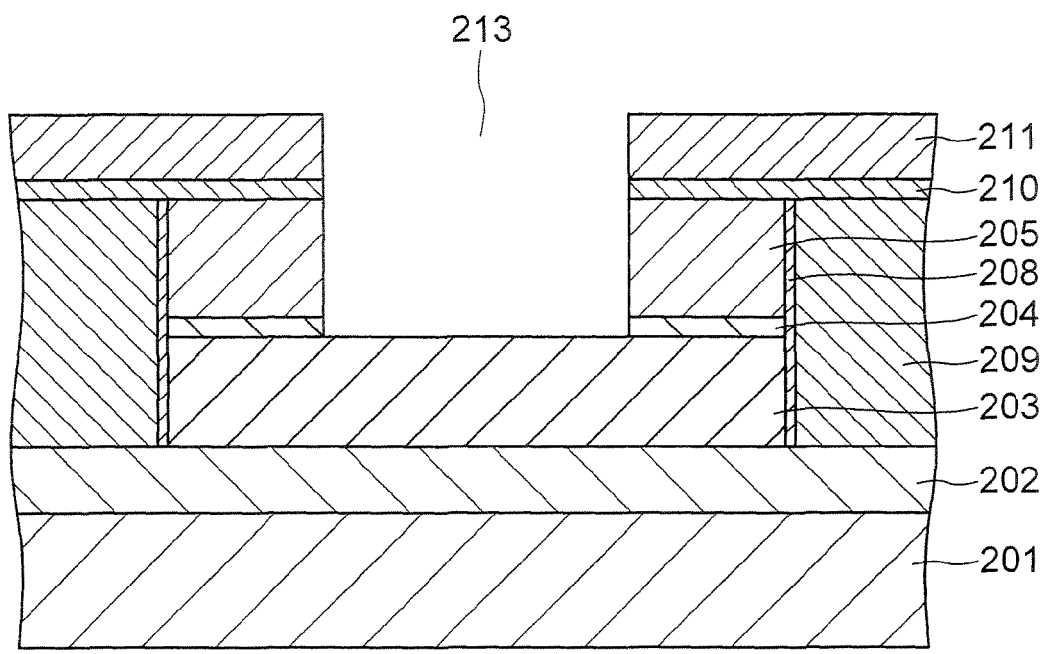

Next, Resist pattern 212 is formed such that the BSG film corresponding to a gate electrode and a spacer adjacent to the gate is exposed and with this resist 212 used as masking material, the SiN film 210, 205, and the thermally-oxidized film 204 are etched up to the face of the SOI substrate so as to form a trench 213 with the top face of the SOI 203 exposed externally (FIG. 2G).

Figure 2H:
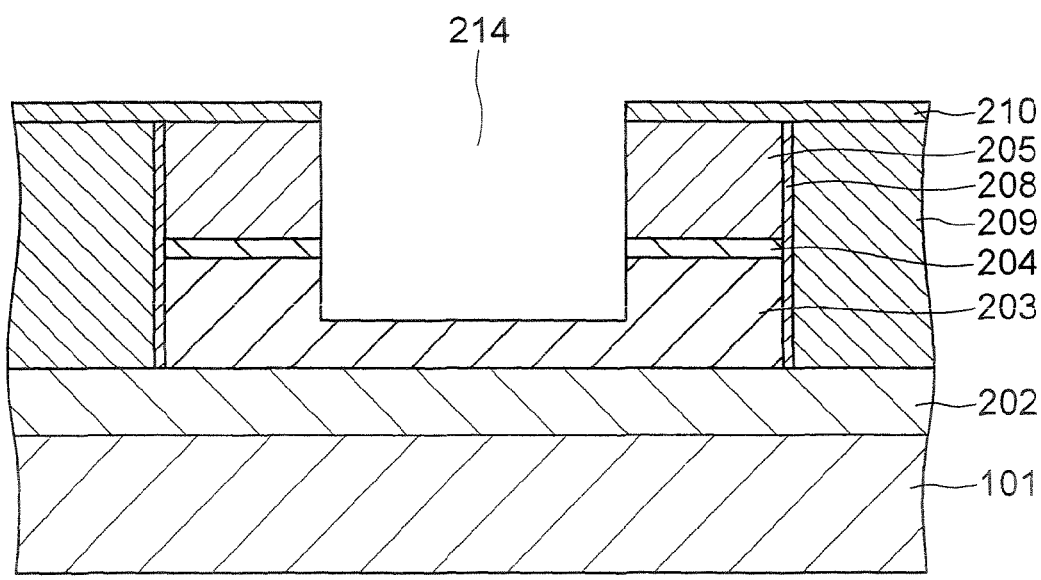
Figure 2:
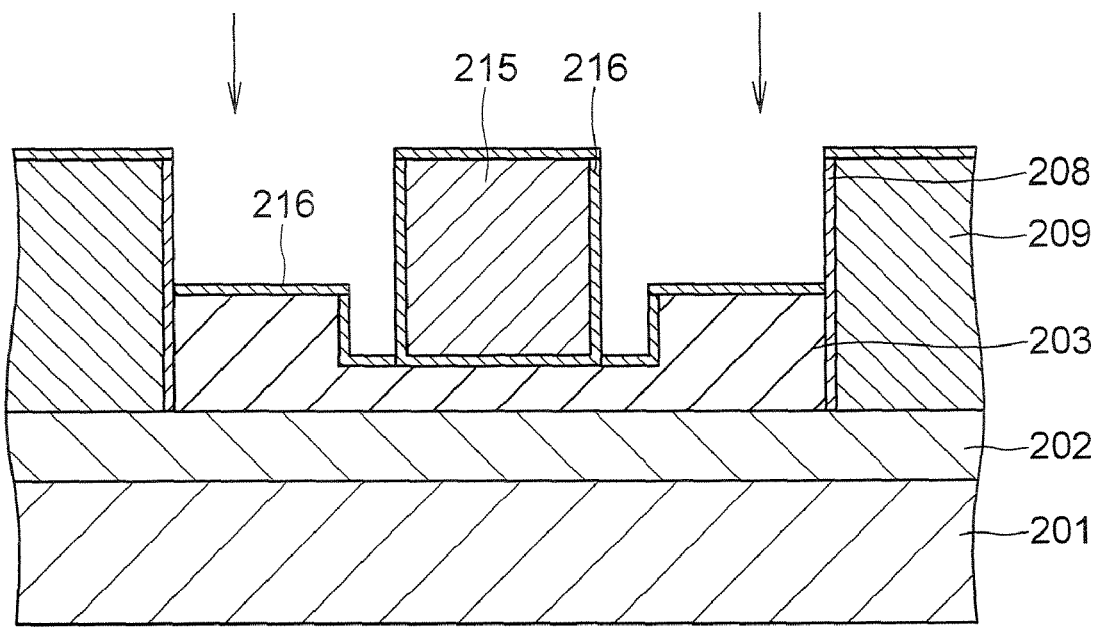

After the remained resist 211 is removed, a pattern for exposing the SOI portion whose film is expected to be thinned is formed again and by etching the exposed SOI film 203 according to CDE method, a deeper trench 214 is formed so as to turn the thickness of the SOI film 203 to a desired thickness, for example, 400 Angstrom (FIG. 2H). Therefore, the thickness at a gate electrode formation expected location is reduced from the initially 1500 Angstrom to 400 Angstrom (FIG. 2H).

Next, by thermal oxidation with this SOI film exposed, thermally-oxidized film is formed in the thickness of 60 Angstrom on the bottom and side wall of the trench 214 and the trench 214 is filled with amorphous silicon doped with no impurity such that it is deposited in the thickness of 2000 Angstrom and then, damascene process is carried out for flattening using the CMP method. Further, by removing the SiN film remained on a portion on the source/drain of a portion formed by burying and the SOI substrate with chemical like $H_3PO_4$, gate electrode 215 is obtained. After thermally-oxidized film 216 is formed on an exposed surface by thermal oxidation, ion implantation is carried out for doping for formation of desired diffusion layer. This ion implantation is carried out under a condition that dose of phosphor or boron is $3E13/cm^2$ and acceleration voltage is 10 keV (FIG. 2I).

Figure 2J:
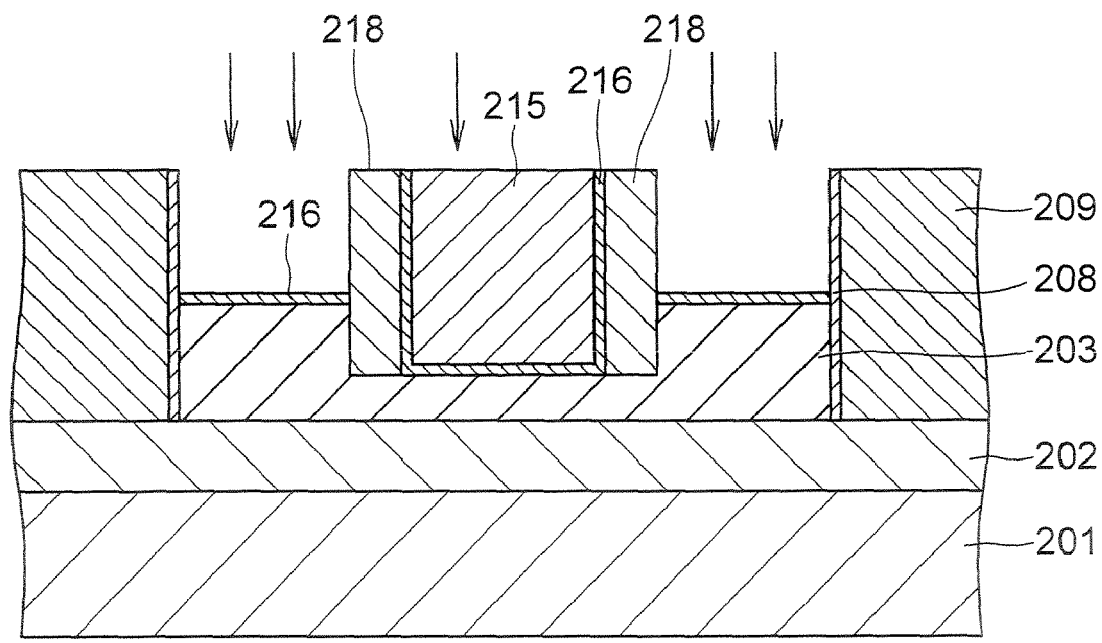

Next, TEOS/SiN/TEOS 200/200/400 Angstrom thick are deposited as layered film on the entire surface of the SOI substrate and etching is carried out for leaving spacer 218 adjacent to the gate electrode 215 within the trench 214 so as to expose oxide film 216 on the top face of the SOI substrate 203 and polysilicon electrode 215. Then, phosphor or boron is ion-implanted into a desired region at a dose of $3E15/cm^2$ or more at an acceleration voltage of 10 keV, so that impurity is activated at high temperature for a short time using RTA method (FIG. 2J).

After activation is ended, the oxidized film 216 is removed, cobalt (Co) is deposited on the entire surface of the SOI substrate and salicide film 219 is formed at a portion making direct contact with silicon by heat treatment. Excess cobalt at a portion in which no silicon exists is removed by etching.

Figure 2K:
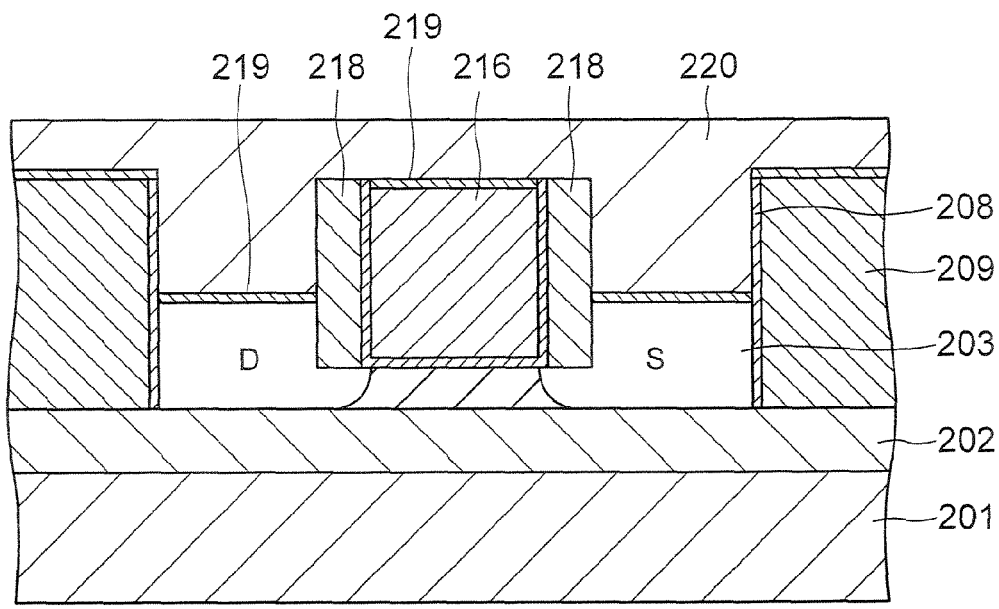
Figure 2L:
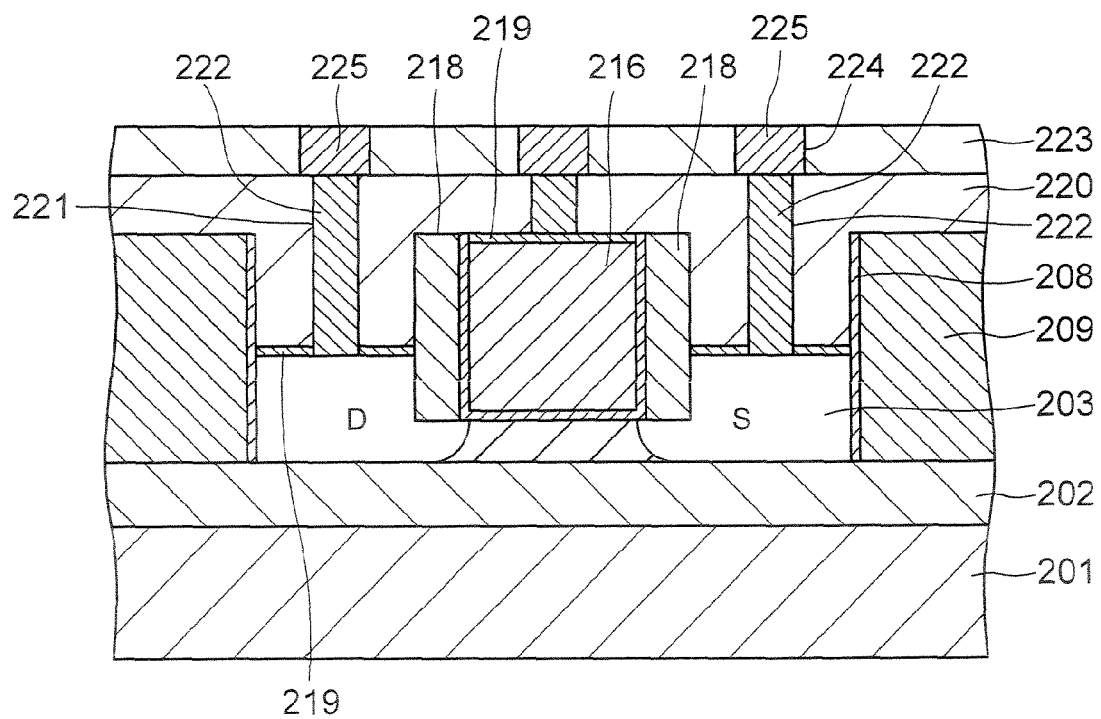

After the salicide film is formed, SiN is deposited in the thickness of 200 Angstrom on the entire surface of wafer and next non-doped silicate glass (NSG) film 120, which is silicate glass doped with no impurity, is deposited in the thickness of 6000 Angstrom and then it is flattened using the CMP method (FIG. 2K).

Next, resist pattern for forming a contact between source/drain region and gate electrode is formed and the NSG film 220 is etched using the RIE method until the top face of the SiN is exposed so as to form a contact hole 221 and remained resist is removed. Next, the SiN film exposed on the bottom of the contact hole 121 is removed by etching so that the top face of SOI/gate polysilicon is exposed within the contact hole 221 and then, three-layered film of Ti/TiN/W are deposited in the thickness of 100/200/3000 Angstrom respectively. Then, the Ti/TiN/W of other portion than the contact portion is removed using the CMP method so that the Ti/TiN/W stacked film 222 is left only inside the contact. Next, NSG film 223 about 3000 Angstrom is deposited and a channel 224 is formed at a portion corresponding to a wiring layer pattern and Cu is deposited therein by plating. Then, SL electrode 225 is formed by etching the Cu at an unnecessary portion using the CMP method.

After that, wiring metal layer and contact are formed using dual damascene process of executing these at the same time as filling a contact with metal (Cu) and finally, a semiconductor device is completed.

Because in the semiconductor device of this embodiment, the thickness of the SOI film at the channel portion is sufficiently small, FD state can be attained so as to increase $\Delta$Vth. This is particularly advantageous when this semiconductor device is used as a semiconductor device containing FBC cell.

Because according to this embodiment, the spacer is formed within the trench whose film thickness is reduced, the thin portion is expanded thereby obtaining a secure FD state.

Although in the examples of the above-described two manufacturing processes, the dimension of the channel in which the gate electrode is to be formed is based on a dimension specified by lithography, it is permissible to set a portion expected to be thinned of the SOI smaller than a portion specified by lithography by using the RIE method for etching to leave the side wall by depositing the BSG film preliminarily before the CDE process.

Figure 3:
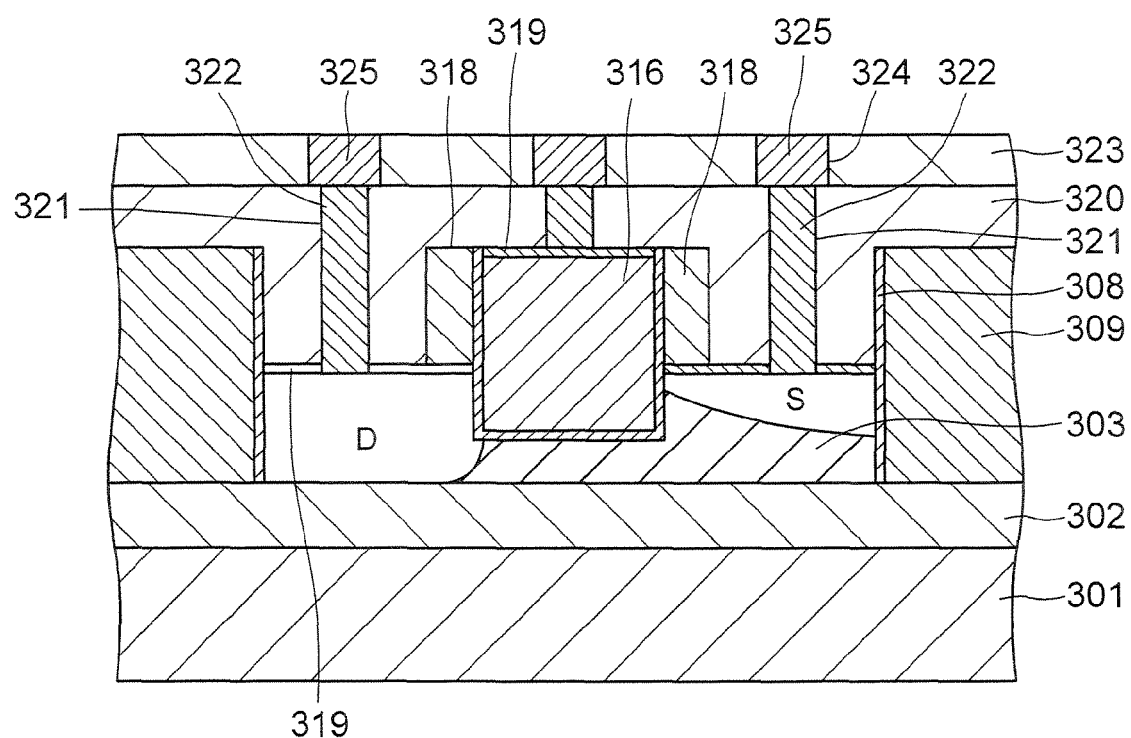
FIG. 3 is a sectional view of the semiconductor device showing the structure of the semiconductor device according to a third embodiment of the present invention.

FIG. 3 is a sectional view of a semiconductor showing the structure of the semiconductor according to the third embodiment of the present invention.

The third embodiment will be described by comparing the structure of the first embodiment shown in FIG. 1L. In FIG. 3, reference numerals of the order from 300 are used and numbers of the order from 10 and from 1 correspond to those in FIG. 1L.

Although the structure of FIG. 3 is almost the same as the first embodiment, a different point is the profile of drain region (D) and source region (S) formed in SOI film 303. That is, although in FIG. 3, the drain region (D) has completely the same profile as the first embodiment and is in contact with thin SOI film in a channel portion, the front end of the source region (S) is located on the surface of the SOI film on the side face of a gate electrode and its diffusion depth is shallow in entire source region.

To obtain such a structure, ion implantation condition for formation of diffusion layer described in FIG. 1J is changed between the drain region and source region and for the source region, the dose and acceleration voltage are reduced as compared to the drain region, as 3E13/cm$^2$ and 10 keV.

Because with such a structure, coupling between the drain region and body region can be set larger than coupling between the source region and body region, deterioration of Vth is unlikely to occur even if the SOI in the channel region is thinned, thereby improving memory performance.

Figure 4:
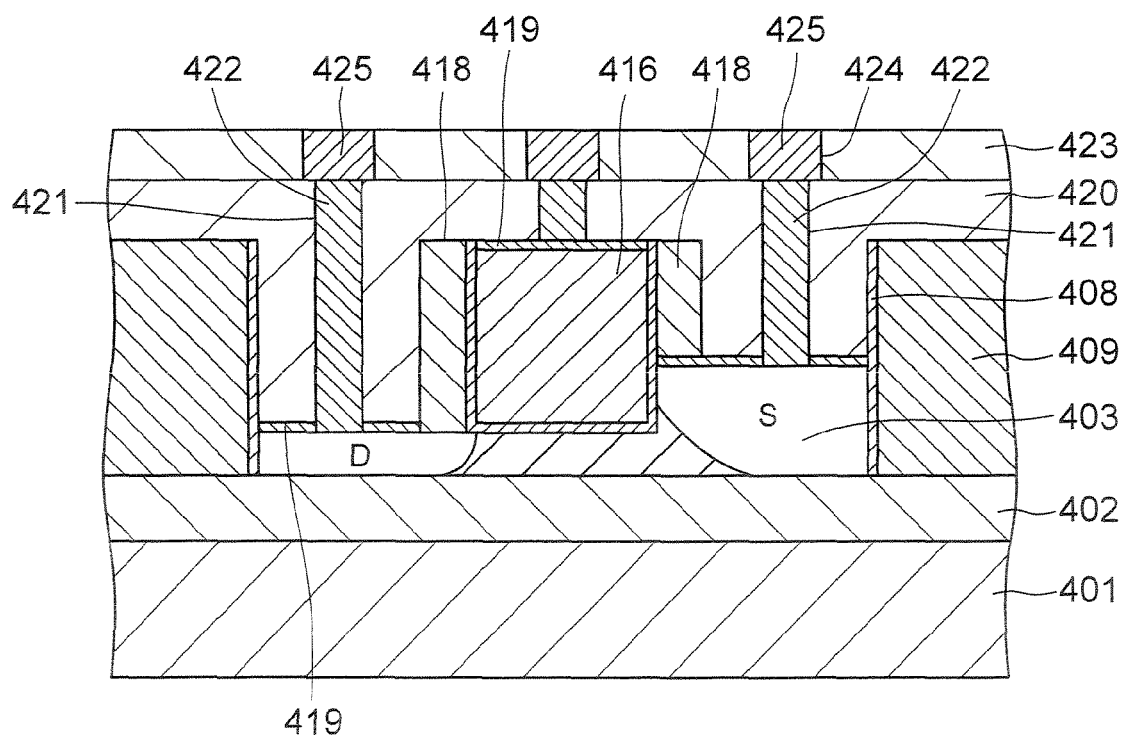
FIG. 4 is a sectional view of a semiconductor device showing the structure of the semiconductor device according to a fourth embodiment of the present invention.

FIG. 4 is a sectional view of a semiconductor showing the structure of the semiconductor according to the fourth embodiment of the present invention.

The fourth embodiment will be described by comparing the structure of the first embodiment shown in FIG. 1L. In FIG. 4, reference numerals of the order from 400 are used and numbers of the order from 10 and from 1 correspond to those in FIG. 1L.

Although the structure of FIG. 4 is almost the same as the first embodiment, a different point is that the thickness of the SOI film constituting the drain region is equal to the thickness of the channel portion.

Such a structure can be obtained by applying the manufacturing process described in the second embodiment. That is, an opening formed in the process of FIG. 2G is expanded over entire channel portion and drain region to reduce thickness of the SOI film over the entire channel portion and drain region.

Although in this embodiment, as same as the embodiment shown in FIG. 3, the drain region (D) is in contact with the channel portion just below the gate electrode, the front end of the source region (S) is located on the surface of the SOI film on the side face of the gate electrode. Such a difference in profile is obtained by adopting the method described about the structure of FIG. 3.

Because in the semiconductor device of the fourth embodiment also, the coupling between the drain region and body region is set larger than the coupling between the source region and body region, deterioration of Vth is unlikely to occur even if the SOI is thinned in the channel region, thereby improving the memory performance.

Because in the semiconductor of the above-described embodiments, the SOI film of the channel portion is thinned sufficiently while maintaining the thickness of the BOX oxide film, complete depletion action for writing data "0" and partial depletion action for writing data "1" are enabled so as to increase $\Delta$Vth. This is advantageous when this semiconductor device is used as a semiconductor memory device containing FBC cell.

Further, because the coupling capacity of the source side of the FBC can be increased, the $\Delta$Vth can be increased.

Because according to the present invention, the thickness of the SOI film in the channel portion of a transistor is set smaller than the thickness of the SOI film of the source/drain diffusion layer portion, an excellent transistor characteristic is secured and a semiconductor device easy to manufacture can be provided.

Such a semiconductor device is effective particularly if it is used as a memory device of the FBC memory cell.

What is claimed is:

1. A semiconductor device comprising:
   a semiconductor substrate;
   an insulating film formed on the semiconductor substrate, the insulating film including a flat upper surface;
   a silicon layer formed on the flat upper surface of the insulating film, the silicon layer including a source region having a first upper surface, a drain region having a second upper surface and a channel region located between the source and drain region, the channel region having a third upper surface;
   a gate electrode of a floating body cell, formed above the channel region of the silicon layer, the gate electrode including a bottom wall, a first side wall continuous with one end of the bottom wall and a second side wall continuous with the other end of the bottom wall;

a first oxide film formed on the first side wall of the gate electrode, the first oxide film including an upper portion and a lower portion located below the upper portion;

a second oxide film formed on the second side of wall of the gate electrode;

a bottom oxide film formed between the bottom wall of the gate electrode and the third upper surface of the channel region;

a first spacer covering the upper portion of the first oxide film;

a second spacer covering the second oxide film, wherein a first thickness of the silicon layer between the second upper surface of the drain region and the flat upper surface of the insulating film is same as a second thickness of the silicon layer between the third upper surface of the channel region and the flat upper surface, and a third thickness of the silicon layer between the first upper surface of the source region and the flat upper surface is larger than the second thickness, the source region contacts the lower portion of the first oxide film without contacting the bottom oxide film and the drain region contacts the bottom oxide film without contacting the second oxide film.

2. The semiconductor device according to claim 1, wherein the second oxide film is wholly faced to the second spacer.

3. The semiconductor device according to claim 1 further comprising a salicide film formed on an upper wall of the gate electrode.

4. The semiconductor device according to claim 1, wherein bottom portions of the source and drain region contact the flat upper surface of the insulating film.

5. The semiconductor device according to claim 1 further comprising a first contact plug formed on the first upper surface of the source region, a second contact plug formed on the upper surface of the drain region and a third contact plug formed above the gate electrode.

6. The semiconductor device according to claim 3, wherein upper portions of the first and second spacers are flush with an upper surface of the salicide film.

\* \* \* \* \*